United States Patent [19]

Kim

[11] Patent Number: 5,694,128
[45] Date of Patent: Dec. 2, 1997

[54] TREE STRUCTURED BINARY ARITHMETIC CODER

[75] Inventor: Jong-Rak Kim, Seoul, Rep. of Korea

[73] Assignee: Daewoo Electronics, Co., Ltd., Seoul, Rep. of Korea

[21] Appl. No.: 551,055

[22] Filed: Oct. 31, 1995

[30] Foreign Application Priority Data

Oct. 31, 1994 [KR] Rep. of Korea ............... 94-28306

[51] Int. Cl.$^6$ ............................................. H03M 7/00
[52] U.S. Cl. ........................ 341/79; 341/51; 341/106; 341/107
[58] Field of Search ........................... 341/79, 51, 106, 341/107

[56] References Cited

U.S. PATENT DOCUMENTS

| | | | |
|---|---|---|---|
| 4,295,125 | 10/1981 | Langdon, Jr. | 340/347 DD |
| 4,494,108 | 1/1985 | Langdon, Jr. et al. | 340/347 DD |
| 4,633,490 | 12/1986 | Goertzel et al. | 375/122 |
| 5,045,852 | 9/1991 | Mitchell et al. | 341/51 |
| 5,414,423 | 5/1995 | Pennebaker | 341/107 |
| 5,471,206 | 11/1995 | Allen et al. | 341/51 |
| 5,550,540 | 8/1996 | Furlan et al. | 341/51 |

*Primary Examiner*—Jeffrey A. Gaffin
*Assistant Examiner*—Jason L. W. Kost
*Attorney, Agent, or Firm*—Pennie & Edmonds, LLP

[57] ABSTRACT

An N valued input symbol is encoded by using a tree structured binary arithmetic coder wherein N is an integer larger than $2^{M-1}$ but not greater than $2^M$ with M being a non-negative integer. First, the input symbol is converted into M bits of binary symbols. Thereafter, a context for a kth bit of the binary symbols is selected among a kth groups of contexts, each of the contexts in a group representing a different probability model of a binary symbol. The kth group of contexts includes $2^{k-1}$ contexts therein and a larger value of k represents a lower bit of the binary symbols, k being an integer from 1 to M. A context corresponding to an Lth bit is selected among an Lth group of contexts based on one or more upper bits thereof, L being an integer ranging from 2 to M. Finally, each of the M bits of the binary symbols is encoded serially based on its corresponding context by using a binary arithmetic coding method.

6 Claims, 6 Drawing Sheets

TREE STRUCTURED BINARY ARITHMETIC CODER

FIELD OF THE INVENTION

The present invention relates to a method and an apparatus for data compression which employs binary arithmetic coding; and, more particularly, to a method and an apparatus for tree structured coding of multi-valued symbol using binary arithmetic coding.

DESCRIPTION OF THE PRIOR ART

Arithmetic coding is one of variable length coding methods that approaches an entropy limit which represents an average code length per symbol in an ideal coding scheme. In the arithmetic coding method, input symbols are ordered in a probability interval from 0 to 1 in a sequence that is known to both an encoder and a decoder. An objective of the arithmetic coding is to create a code stream that is a binary fraction pointing to an interval corresponding to an input symbol being coded. Coding a multiplicity of symbols is a process of subdividing the probability interval into smaller and smaller subintervals, always in proportion to the probability of a particular symbol. As long as the code stream is not allowed to point outside the subinterval assigned to a corresponding symbol, the decoder will recover the original input symbols. As the subdivision process goes on, the length of a subinterval gets smaller and more precision is necessary for the subinterval length (generally referred to as "A") and the current position which the code stream points at (generally referred to as "C"). Therefore, each time A drops below some convenient minimum value, an interval rescaling or a renormalization of A and C is performed.

Generally, an input to the arithmetic coder is a multi-valued symbol. Meanwhile, a binary arithmetic coding method is adopted by a standard image processing scheme such as JPEG (Joint Photographic Experts Group). The binary arithmetic coding method works exactly as stated above, except that an input symbol has only two values. The binary arithmetic coding method is chosen for an efficient implementation. For example, using the binary input symbol allows one to make simple implementation of the interval rescaling that eliminates a need for a multiplication.

Restricting inputs to two-valued symbols requires a translation from a multi-valued symbol to a sequence of binary symbols.

In a conventional encoder employing the binary arithmetic coding method, a multi-valued input symbol is converted to a sequence of binary symbols and then each binary symbol is coded by using binary arithmetic coding.

Referring to FIG. 1, there is an example of a conventional encoder employing a binary arithmetic coder when the inputs thereof are multi-valued symbols. Table 1 shows input symbol values and sequences of binary symbol values converted therefrom which are used in the encoder 1 shown in FIG. 1.

As shown in Table 1, an input symbol is assumed to be of an integer value ranging from 0 to 6, and is converted to 3 bit binary symbols. If a possible number of input symbol values is N which is larger than $2^{M-1}$ but not greater than $2^M$, then the multi-valued input symbol is converted to M-bit binary input symbols and each bit is coded by using the binary arithmetic coding method.

TABLE 1

| MULTI-VALUED INPUT SYMBOL | BINARY INPUT SYMBOLS ($B_2$, $B_1$, $B_0$) |
|---|---|
| 0 | 0 0 0 |
| 1 | 0 0 1 |
| 2 | 0 1 0 |
| 3 | 0 1 1 |
| 4 | 1 0 0 |
| 5 | 1 0 1 |
| 6 | 1 1 0 |
| unused | 1 1 1 |

An actual coding or mapping process for a given input symbol depends on statistical properties of the input symbols. That is, parameters used in the coding process varies according to the characteristics of the input symbols. In the sequence of binary symbols representing a multi-valued input symbol, each bit has different statistical property and different coding processes are applied to each of the binary symbols. Therefore, each of the three bits ($B_2$, $B_1$, $B_0$) is coded at the binary arithmetic coder with a different statistical model or context. The context is referred to as an index into a table of decision probabilities used by the binary arithmetic coder and related to the interval length A.

In FIG. 1, a multi-valued input symbol is converted to three bit binary symbols in a binary converter 10 and is fed serially to a BAC 30 wherein BAC represents a binary arithmetic coder. Three different contexts, e.g., 0, 1, 2 are used to encode the three bits $B_2$, $B_1$, $B_0$, respectively. Specifically, the first bit $B_2$ is coded with the context 0.

In the conventional encoder 1 stated above, a context for the bit $B_1$ is predetermined independently of the bit $B_2$. In other words, whether the bit $B_2$ is "0" or "1" does not affect the context for the bits $B_1$ and $B_0$. However, for a general input data such as image signal, the three bits have a certain correlation with each other. Therefore, from the viewpoint of coding efficiency, it is advantageous to find a coding method which can utilize the correlation, instead of using a same context irrespective of other binary symbols.

SUMMARY OF THE INVENTION

It is, therefore, an object of the invention to provide an encoding method and apparatus employing binary arithmetic coding wherein the statistical property of input symbols is fully utilized.

In accordance with the present invention, there is provided a method for encoding N-valued input symbols wherein N is an integer larger than $2^{M-1}$ but not greater than $2^M$, M being a non-negative integer. The method is initiated by converting each of the input symbols to M bits of binary symbols. A context for each of the M bits of binary symbols is then selected among a multiplicity of contexts, wherein the multiplicity of contexts are classified into M groups of contexts and a kth group of contexts includes $2^{k-1}$ contexts with a larger value of k representing a lower bit of the binary symbols. A context corresponding to the first bit of the binary symbols is included in the first group of contexts and a context corresponding to the Lth bit, L being an integer ranging from 2 to M, is selected among the Lth group of contexts based on the statistical properties of one or more upper bits of the Lth bit. Subsequently, each of the M bits of the binary symbols is encoded serially based on the context selected therefor by using a binary arithmetic coding method.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
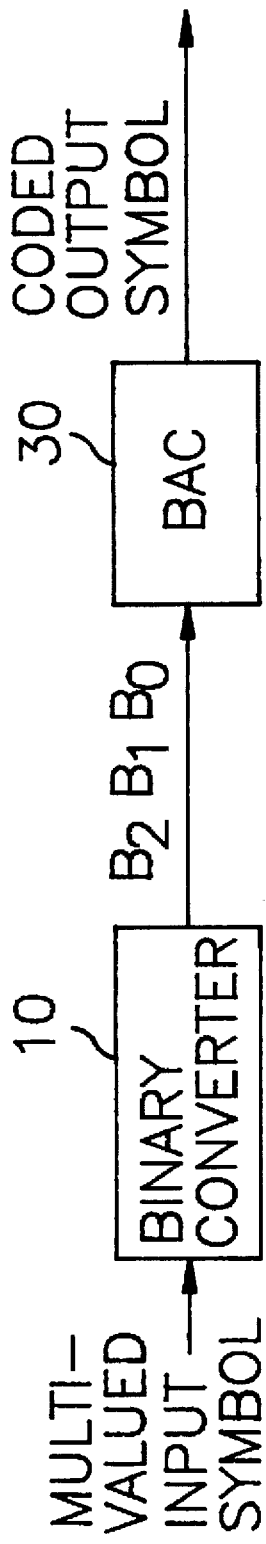
FIG. 1 shows an example of a conventional encoder for coding multi-valued input symbols.
Figure 2:
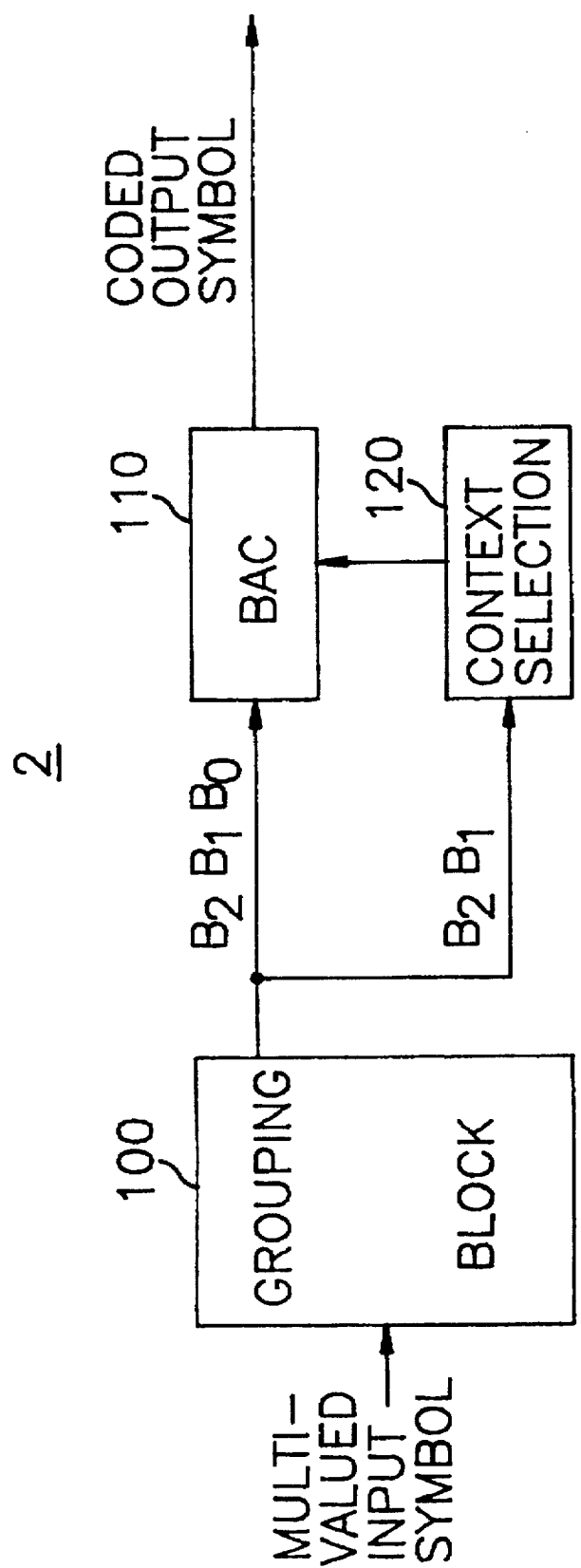
FIG. 2 illustrates an encoder of the present invention for the multi-valued input symbol of FIG. 1.

Referring to FIG. 2, an encoder 2 of the present invention is illustrated, wherein the same multi-valued input symbols as those of FIG. 1 (or Table 1) are used. At the encoder of the present invention, conversion of a multi-valued input symbol to binary symbols takes place at a grouping block 100. A grouping process is essentially similar as the binary conversion depicted at Table 1. For input symbols of a various formation, a different grouping scheme may be employed. However, it can be summarized as the process of mapping an input symbol to group index bits, wherein all possible symbol values are separated into two subgroups in a first stage of the grouping process, an upper group denoted as a group index bit 1 and a lower group denoted as a bit 0. In the subsequent stages of the grouping process, symbol values included in one subgroup are further divided until not more than one symbol value is included per subgroup. The three group index bits ($B_2$, $B_1$, $B_0$) are used in the encoder shown in FIG. 2. The first group index bit $B_2$ denotes that whether an input symbol belongs to an upper group or a lower group in the first stage of grouping process. The other group index bits are related to the subsequent stages of the grouping process.

The group index bits ($B_2$, $B_1$, $B_0$) are coupled serially to a BAC 110. In the present invention, contexts for the bits $B_1$ and $B_0$ are not predetermined as in the prior art encoder 1 shown in FIG. 1 but are determined at a context selection block 120. The contexts are fed to the BAC 110 along with the corresponding group index bits $B_1$ and $B_0$.

Figure 3:
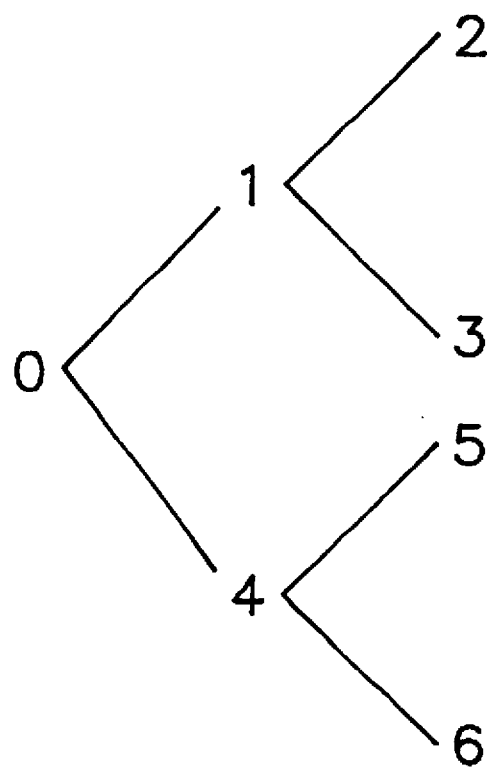
FIG. 3 is a diagram for explaining the context selection scheme.

In the encoder 2 shown in FIG. 2, $B_2$ is encoded at the BAC 110 with a predetermined context, e.g., 0. However, the context for coding the second bit $B_1$ is determined at the context selection block 120 in response to the bit $B_2$ which is an upper bit of the $B_1$. For example, if $B_2$ is 1, the context for $B_1$ is 4 and if $B_2$ is 0, the context for $B_1$ is 1. Similar remarks are applied to the third bit $B_0$. The context for encoding the third bit $B_0$ is determined at the context selection block 120 in response to the bits $B_2$ and $B_1$ which are upper bits of $B_0$. FIG. 3 is a tree diagram for explaining the context selection scheme stated above. If the context for $B_1$ is 1, 2 or 3 can be selected as the context for $B_0$ but 5 or 6 cannot be selected. Conversely, if the context for $B_1$ is 4, 5 or 6 can be the context for $B_0$ but 2 or 3 cannot be selected. In short, a context for a certain input bit is determined in a hierarchical manner as shown in FIG. 3 according to upper bits of that input bit.

For example, the contexts 0, 1 and 2 are employed to encode the bits "001". For "101", the contexts 0, 4 and 5 are employed. At Table 2, combinations of contexts are presented with corresponding group index bits for the same set of input symbols as that of Table 1.

It is noted that the second bit $B_1$ is encoded by using the context 1 for the input symbol 1 and encoded by using the context 4 for the input symbol 5. A number of total contexts used at the encoder 2 of the present invention is larger than that of the conventional encoder 1 depicted in FIG. 1. However, by using various contexts, the statistical properties of the input symbols can be fully utilized, to thereby provide more effective coding results.

TABLE 2

| input symbol | group index bits ($B_2$, $B_1$, $B_0$) | contexts for $B_2$, $B_1$ and $B_0$ |
|---|---|---|
| 0 | 0 0 0 | 0 1 2 |
| 1 | 0 0 1 | 0 1 2 |
| 2 | 0 1 0 | 0 1 3 |
| 3 | 0 1 1 | 0 1 3 |
| 4 | 1 0 0 | 0 4 5 |
| 5 | 1 0 1 | 0 4 5 |
| 6 | 1 1 0 | 0 4 6 |
| unused | 1 1 1 | 0 4 6 |

The group index bits are coded at the BAC 110 in response to the contexts determined as stated above. Subsequent input symbols are processed at the encoder 2 of the present invention in a manner described above, to thereby provide coded output symbols.

Figure 4A:
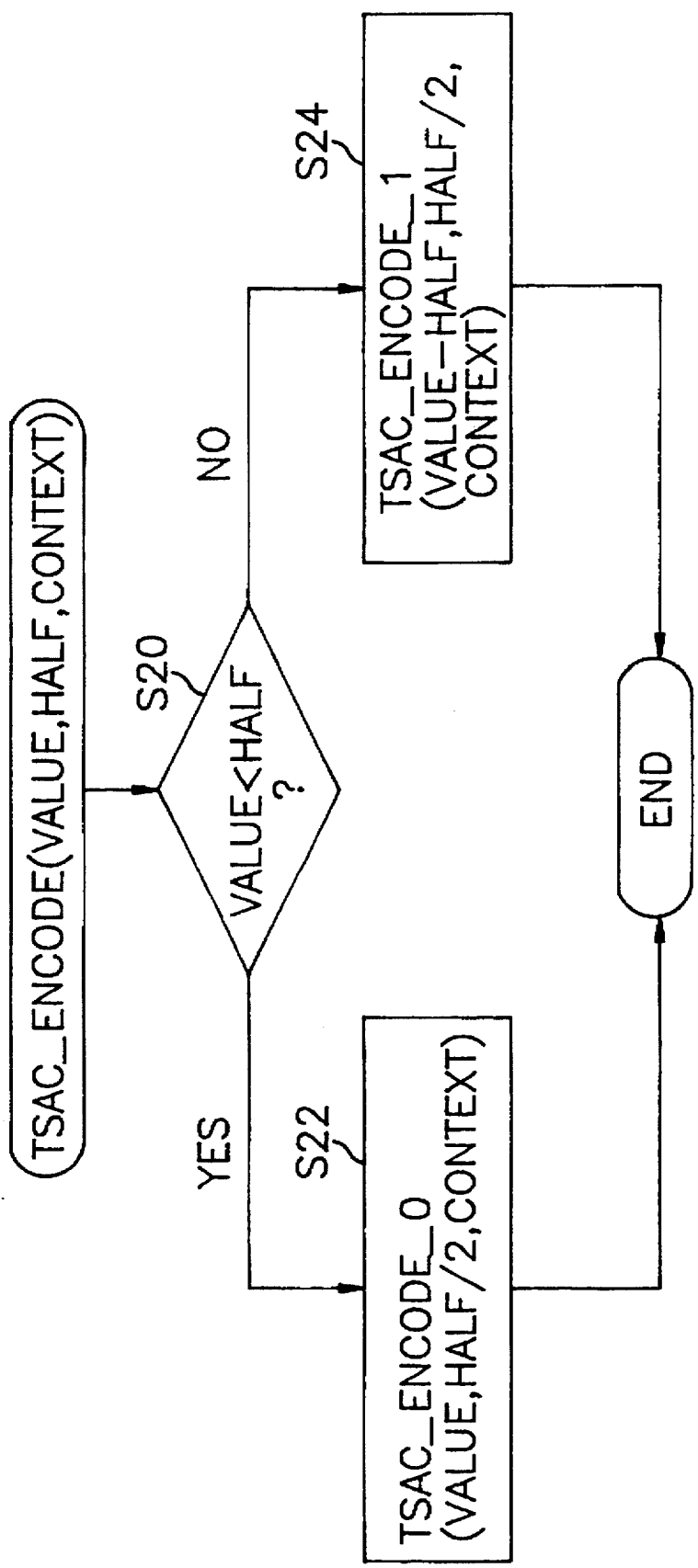
FIGS. 4A to 4C represent a coding procedure in accordance with the present invention.
Figure 4B:
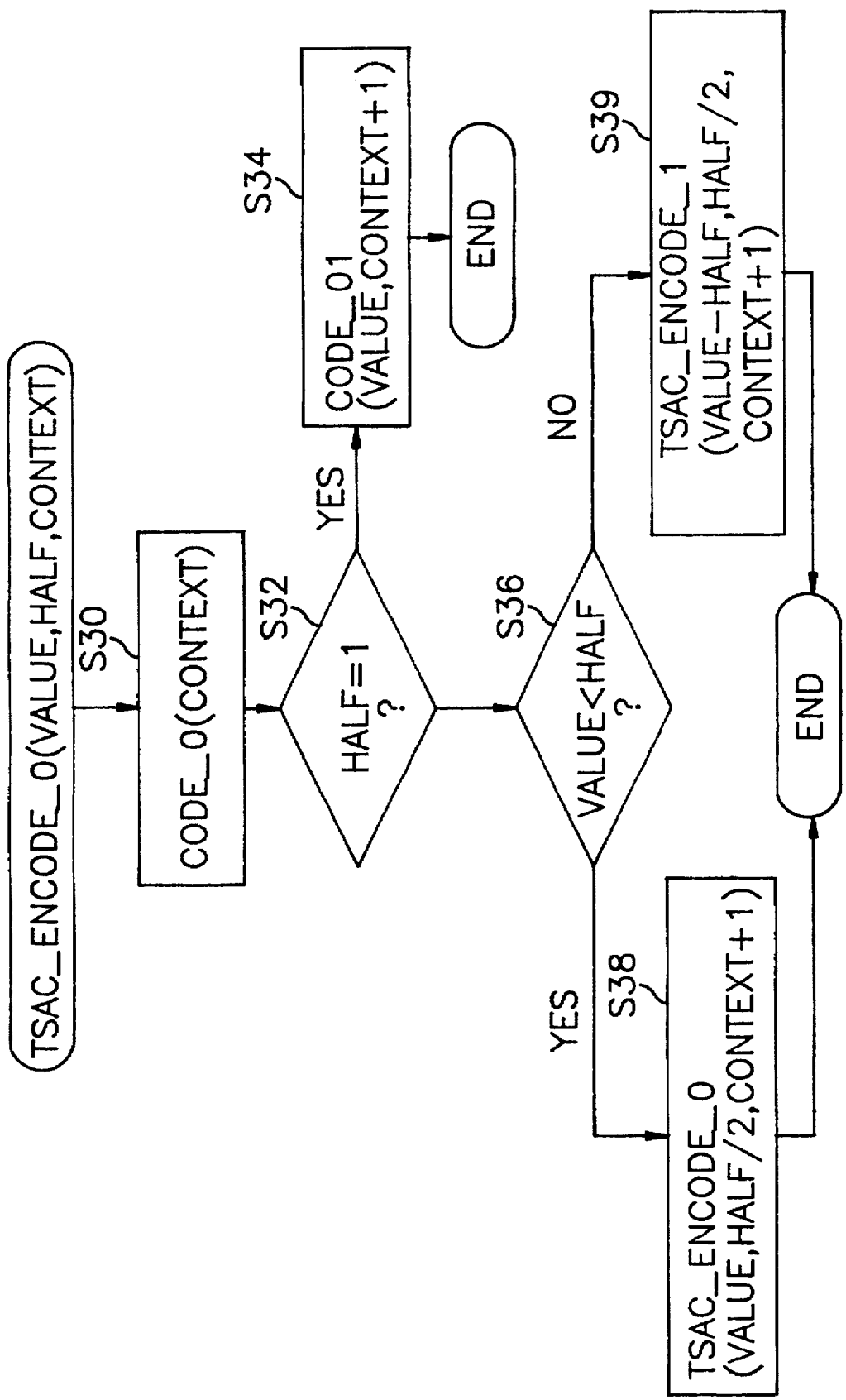
Figure 4C:
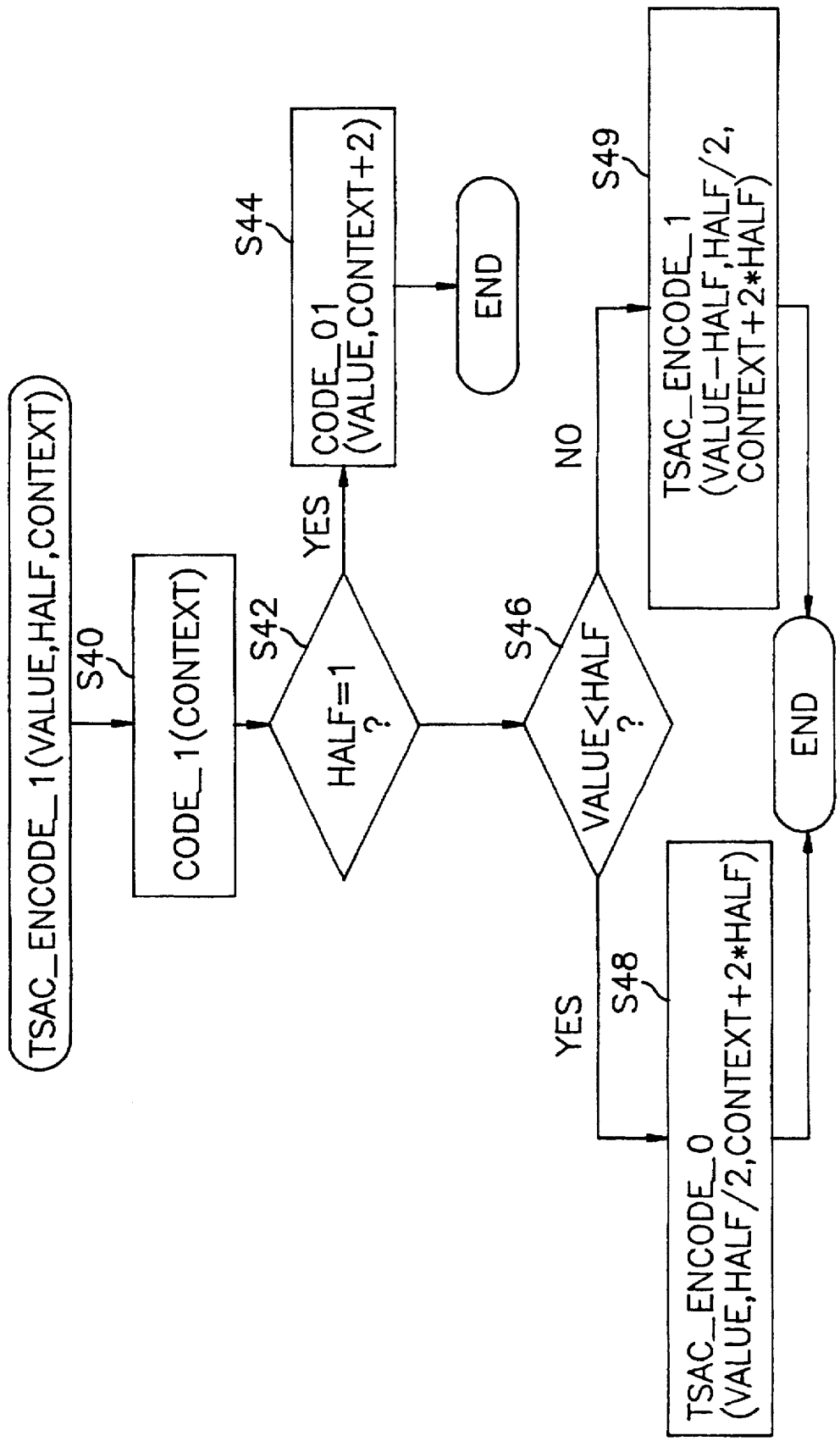

Referring to FIGS. 4A to 4C, the coding process performed at the encoder 2 of the present invention shown in FIG. 2 is restated in a form of flow charts.

A subroutine TSAC_ENCODE(VALUE, HALF, CONTEXT) represent a procedure for encoding a multi-valued input symbol, wherein VALUE denotes an input symbol value and CONTEXT represents a initial context for encoding the first group index bit. For simplicity, the initial context value is assumed to be 0. It is assumed that the input symbol have a plurality of integer values, e.g., 0 to 6. However, in case input symbols have irregular values, e.g., 0.001, 0.013, 0.025, etc, by mapping each of the values to integer 0 to N-1, wherein N is a number of possible input values, the same procedure is applicable. The variable HALF represent $2^{M-1}$ when the number of input values is larger than $2^{M-1}$ but not greater than $2^M$. For the input symbols of 0 to 6, HALF is 4. The number of total contexts is as many as (2*HALF-1). The procedure depicted in FIGS. 4A to 4C will also be explained for the input symbols 1 and 5.

In the FIGS. 4B to 4C, CODE_0(CONTEXT) and CODE_1(CONTEXT) represent subroutines for encoding group index bit of value 0 and 1 with the given context, respectively, and CODE_01(VALUE, CONTEXT) denotes a subroutine which calls CODE_0(CONTEXT) in case VALUE is 0 and calls CODE_1(CONTEXT) in case VALUE is 1.

At first, whether the input symbol value belongs to an upper group or a lower group is determined at step S20. For the input symbol "1" which belongs to a lower group at the first stage of grouping, VALUE is smaller than HALF and the subroutine TSAC_ENCODE_0(1, 2, 0) is called at step S22 with its HALF value being divided by two. In TSAC_ENCODE_0(1, 2, 0), the first group index bit is coded at CODE_0(0) at step S30. At step S32, it is determined whether further grouping process is necessary. In case HALF is 1, VALUE is one of only two values, i.e., 0 and 1, and can be coded by using the subroutine CODE_01 (VALUE, CONTEXT+1) at step S34. However, HALF is now 2, and therefore, VALUE is compared again with HALF at step S36, and subroutine TASC_ENCODE_0(1, 1, 1) is recursively called at step S38. The procedure continues to the step S30 wherein CODE_0(1) is called to encode the second group index bit and then to the step S32. This time HALF is 1 and CODE_01(1,2) is called to encode the third group index bit at the step S34 and the encoding process ends.

For the input symbol "5" which belongs to an upper group at the first stage of the grouping, VALUE is larger than HALF and the subroutine TSAC_ENCODE_1(1, 2, 0) is called at step S24 with VALUE being subtracted by HALF and HALF being divided by two. In TSAC_ENCODE_1(1, 2, 0), the first group index bit is coded by calling CODE_1(0) at step S40. The HALF is now 2, and therefore, VALUE is further compared with HALF at step S46, and the subroutine TSAC_ENCODE_0(1, 1, 4) is called at step S48. The procedure continues to the step S30 wherein CODE_0(4) is called to encode the second group index bit and then to the step S32 in the subroutine TSAC_ENCODE_0(1, 1, 4). This time HALF is 1 and CODE_01(1, 5) is called to encode the third group index bit at the step S34 and the encoding process ends.

By reviewing the procedure stated above, it can be known that the contexts used for the input symbols 1 and 5 match with those presented in Table 2.

Although the encoder of the present invention is explained in accordance with the 7-valued input symbols, slight modifications will render the encoder of the present invention to deal with various input models.

While the present invention has been described with respect to the particular embodiments, it will be apparent to those skilled in the art that various changes and modifications may be made without departing from the spirit and scope of the invention as defined in the following claims.

What is claimed is:

1. A method for encoding an N-valued input symbol wherein N is an integer which is larger than $2^{M-1}$ but not greater than $2^M$, M being a non-negative integer, which comprises the steps of:

converting the input symbol to M bits of binary symbols;
selecting M contexts each of which corresponds to one of said M bits of binary symbols among a multiplicity of contexts, each of the multiplicity of contexts representing a different probability model for one of the binary symbols, wherein the multiplicity of contexts are classified into M groups of contexts, a kth group of contexts includes $2^{k-1}$ contexts, k being an integer from 1 to M, a larger value of k represents a lower bit of the binary symbols, a context corresponding to a first bit of the binary symbols is included in a first group of contexts and a context corresponding to an Lth bit of the binary symbols, L being an integer ranging from 2 to M, is selected among an Lth group of contexts in response to one or more upper bits of the Lth bit; and encoding each of said M bits of binary symbols in response to its corresponding context by using a binary arithmetic coding method.

2. The method of claim 1, wherein said M contexts are sequentially selected for the M bits of binary symbols, starting with the first bit and then proceeding to lower bits.

3. The method of claim 2, wherein said M bits of binary symbols are sequentially encoded starting with the first bit and then proceeding to lower bits.

4. An apparatus for encoding an N-valued input symbol wherein N is an integer which is larger than $2^{M-1}$ but not greater than $2^M$, M being a non-negative integer, said apparatus comprising:

means for converting the input symbol to M bits of binary symbols; means for selecting M contexts each of which corresponds to one of said M bits of binary symbols among a multiplicity of contexts, each of the multiplicity of contexts representing a different probability model for one of the binary symbols, wherein the multiplicity of contexts are classified into M groups of contexts, a kth group of contexts includes $2^{k-1}$ contexts, k being an integer from 1 to M, a larger value of k represents a lower bit of the binary symbols, a context corresponding to a first bit of the binary symbols is included in a first group of contexts and a context corresponding to an Lth bit of the binary symbols, L being an integer ranging from 2 to M, is selected among an Lth group of contexts in response to one or more upper bits of the Lth bit; and a binary arithmetic coder for encoding each of said M bits of the binary symbols in response to its corresponding context.

5. The apparatus of claim 4, wherein said selecting means includes means for sequentially selecting the M contexts for the binary symbols, starting with the first bit and then proceeding to lower bits.

6. The apparatus of claim 5, wherein said binary arithmetic coder includes means for sequentially encoding the binary symbols starting with the first bit and then proceeding to lower bits.

* * * * *